United States Patent
Yu et al.

(10) Patent No.: US 8,619,490 B2
(45) Date of Patent: Dec. 31, 2013

(54) SEMICONDUCTOR MEMORY DEVICES

(75) Inventors: Hak-soo Yu, Seongnam-Si (KR);
Hong-sun Hwang, Suwon-Si (KR);
Kwan-young Oh, Suwon-si (KR);
In-gyu Baek, Seoul (KR); Jin-hyoung Kwon, Seongnam-Si (KR)

(73) Assignee: Samsung Electronics Co., Ltd., Gyeonggi Do (KR)

( * ) Notice: Subject to any disclaimer, the term of this patent is extended or adjusted under 35 U.S.C. 154(b) by 191 days.

(21) Appl. No.: 13/153,749

(22) Filed: Jun. 6, 2011

(65) Prior Publication Data
US 2011/0305059 A1 Dec. 15, 2011

(30) Foreign Application Priority Data
Jun. 10, 2010 (KR) .................. 10-2010-0055116

(51) Int. Cl.
*G11C 8/00* (2006.01)
(52) U.S. Cl.
USPC ....................................... 365/230.03; 365/51
(58) Field of Classification Search
USPC ........................ 365/230.03, 51, 63
See application file for complete search history.

(56) References Cited

U.S. PATENT DOCUMENTS

| 5,907,516 | A * | 5/1999 | Kwon et al. ................. 365/203 |
| 7,595,559 | B2 * | 9/2009 | Baek ............................. 257/777 |
| 7,898,893 | B2 * | 3/2011 | Park et al. ................. 365/230.03 |
| 8,185,690 | B2 * | 5/2012 | Miura et al. .................. 711/115 |
| 2002/0114178 | A1 * | 8/2002 | Sakui .............................. 365/51 |
| 2002/0199056 | A1 * | 12/2002 | Ayukawa et al. ............. 711/106 |

FOREIGN PATENT DOCUMENTS

| JP | 2004023062 A | 1/2004 |
| JP | 2009158020 A | 7/2009 |
| KR | 1020090027561 | 3/2009 |

* cited by examiner

*Primary Examiner* — Vu Le
(74) *Attorney, Agent, or Firm* — Harness, Dickey & Pierce, P.L.C.

(57) ABSTRACT

Semiconductor memory devices include a first storage layer and a second storage layer, each of which includes at least one array, and a control layer for controlling access to the first storage layer and the second storage layer so as to write data to or read data from the array included in the first storage layer or the second storage layer in correspondence to a control signal. A memory capacity of the array included in the first storage layer is different from a memory capacity of the array included in the second storage layer.

22 Claims, 18 Drawing Sheets

(a)

(b)

(c)

(a)  LAY3 — ARR31

LAY2 — ARR21

LAY1 — ARR11

(b)

(a)

(b)

SEMICONDUCTOR MEMORY DEVICES

CROSS-REFERENCE TO RELATED APPLICATION

This application claims priority under 35 U.S.C. §119 to Korean Patent Application No. 10-2010-0055116, filed on Jun. 10, 2010 in the Korean Intellectual Property Office (KIPO), the entire contents of which is incorporated herein by reference.

BACKGROUND

Example embodiments of inventive concepts relate to semiconductor memory devices, and more particularly, to three-dimensional semiconductor memory devices with an optimal and/or improved structure.

To improve integration density of semiconductor memory devices, semiconductor memory devices may be three-dimensionally manufactured. Three-dimensionally manufactured semiconductor memory devices may include a plurality of arrays and the arrays may be arranged according to various layouts.

SUMMARY

Example embodiments of the inventive concepts may provide three-dimensional semiconductor memory devices with an optimal and/or improved structure.

According to example embodiments of the inventive concepts, there is provided a semiconductor memory device including a first storage layer and a second storage layer, each of which includes at least one array; and a control layer for controlling an access to the first storage layer and the second storage layer so as to write data to or read data from the array included in the first storage layer or the second storage layer in correspondence to a control signal. A memory capacity of the array included in the first storage layer is different from a memory capacity of the array included in the second storage layer.

From among the first storage layer and the second storage layer, a memory capacity of an array included in a storage layer that is closer to the control array may be smaller than a memory capacity of an array included in the other storage layer. In this case, an access time of an array of a storage layer that has a smaller memory capacity than the other storage layer may be shorter than that of the other storage layer.

From among the first storage layer and the second storage layer, a storage layer that is closer to the control layer may have a smaller array size than the other storage layer. From among the first storage layer and the second storage layer, a storage layer that is closer to the control layer may include a smaller number of arrays than the other storage layer. Each of the first storage layer and the second storage layer may include the same number of arrays. Each of the first storage layer and the second storage layer may include a plurality of arrays, and arrays of the same storage layer may have the same sizes. Each of the first storage layer and the second storage layer may include a plurality of arrays, and arrays of the same storage layer may have smaller sizes as being closer to the control layer.

The array of each of the first storage layer and the second storage layer may be divided into at least one sub array, from among the first storage layer and the second storage layer, a size of a sub array of an array of a storage layer that is closer than the other storage layer to the control layer may be smaller than that of the other storage layer. From among the first storage layer and the second storage layer, an array number of a storage layer that is closer than the other storage layer to the control layer may be smaller than that of the other storage layer. The first storage layer and the second storage layer may include the same number of arrays. Each of the first storage layer and the second storage layer may include a plurality of arrays, and arrays included in the same storage layer may include sub arrays of the same size. Each of the first storage layer and the second storage layer may include a plurality of arrays, and arrays included in the same storage layer may include smaller sub arrays as being closer to the control layer.

Each of the first storage layer and the second storage layer may include the same kind of arrays. The first storage layer and the second storage layer may include different kinds of arrays. The control layer may include a first control logic for controlling the first storage layer; a second control logic for controlling the second storage layer and an integration control logic for controlling the first and second control logics and transmitting a control signal and data between the different kinds of arrays. The control signal and data may be transmitted to the at least one array of each of the first and second storage layers through a though silicon via (TSV) passing through the at least one array of each of the first and second storage layers.

According to example embodiments of the inventive concepts, a semiconductor memory device may include a first storage layer with at least one first array, a second storage layer with at least one second array, a memory capacity of the first storage layer different than a memory capacity of the second storage layer and a control layer for controlling read/write access to the first storage layer and the second storage layer based on a control signal.

According to further example embodiments of the inventive concepts, a semiconductor memory device may include a plurality of storage layers each including at least one array, memory capacities of the arrays being relatively smaller the closer one of the plurality of storage layers is to the control layer and a control layer configured to control read/write access to the arrays of the plurality of storage layers based on a control signal.

According to yet further example embodiments of the inventive concepts, a semiconductor memory device may include a memory controller, a first memory array and a second memory array a greater distance from the memory controller than the first memory array, a first word line of the first memory array connected to fewer memory cells than a second word line of the second memory array.

BRIEF DESCRIPTION OF THE DRAWINGS

Example embodiments of the inventive concepts will be more clearly understood from the following brief description taken in conjunction with the accompanying drawings. FIGS. 1-20 represent non-limiting, example embodiments as described herein.

FIG. 1 includes block diagrams illustrating semiconductor memory devices according to example embodiments of the inventive concepts;

FIG. 2 includes block diagrams illustrating examples of storage layers of FIG. 1B;

FIG. 4 is a block diagram illustrating other examples of storage layers of FIG. 1B;

FIG. 5 is a perspective schematic illustrating semiconductor memory devices including storage layers of FIG. 4;

FIG. 6 is a block diagram illustrating still other examples of storage layers of FIG. 1B;

FIG. 7 is a perspective schematic illustrating semiconductor memory devices including storage layers of FIG. 6;

FIG. 8 includes graphs illustrating access times of storage layers illustrated in FIGS. 2-7;

FIG. 9 is a block diagram illustrating yet other examples of storage layers of FIG. 1B;

FIG. 10 is a perspective schematic illustrating semiconductor memory devices including storage layers of FIG. 9;

FIG. 11 is a graph illustrating access times of storage layers of FIG. 9;

FIG. 12 includes block diagrams illustrating further examples of storage layers of FIG. 1B;

FIG. 13 is a perspective schematic illustrating semiconductor memory devices including storage layers of FIG. 12;

FIG. 14 is a block diagram illustrating still further examples of storage layers of FIG. 1B;

FIG. 15 is a perspective schematic illustrating semiconductor memory devices including storage layers of FIG. 14;

FIG. 16 is a block diagram illustrating yet further examples of storage layers of FIG. 1B;

FIG. 17 is a perspective schematic illustrating semiconductor memory devices including storage layers of FIG. 16;

FIG. 18 includes block diagrams illustrating examples of control layers illustrated in FIG. 1;

FIG. 19 is a block diagram illustrating computing system apparatuses including semiconductor memory devices according to example embodiments of the inventive concepts; and FIG. 20 is a block diagram of even further examples of storage layers of FIG. 1B.

Figure 1:
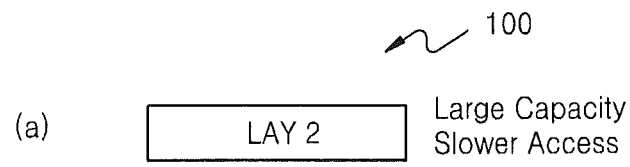
Figure 1:
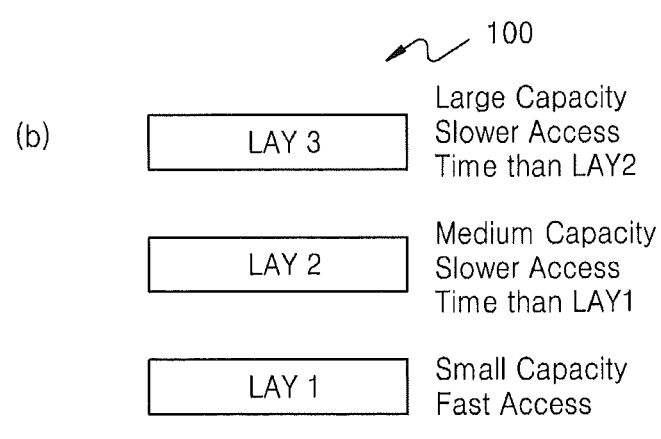
Figure 1:
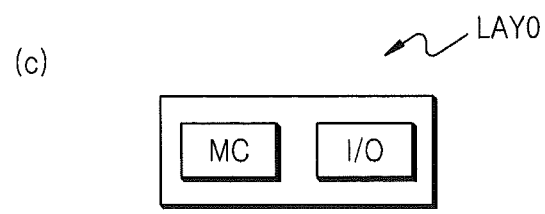

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments of the inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 includes block diagrams illustrating semiconductor memory devices according to example embodiments of the inventive concepts. Referring to FIG. 1(a), a semiconductor memory device 100 according to example embodiments may include a first storage layer LAY1, a second storage layer LAY2 and a control layer LAY0. Referring to FIG. 1(b), the semiconductor memory device 100 according to the example embodiments may include a first storage layer LAY1, a second storage layer LAY2, a third storage layer LAY3 and a control layer LAY0. Each of the first through third storage layers LAY1-LAY3 may include at least one array ARR (not shown). The control layer LAY0 may include, as illustrated in FIG. 1(c), a memory controller MC and an input/output circuit I/O. In correspondence to a control signal output from the memory controller MC, data may be input to or output from the first through third storage layers LAY1-LAY3. The input and output of data may be performed through the input/output circuit I/O.

The control signal and data may be transmitted to arrays included in layers through a through-silicon-via (TSV). Referring to FIG. 1, the first storage layer LAY1, which is closest to the control layer LAY0 may include at least one array with a small memory capacity and a short access time. A small volume of data with a high access frequency may be stored in the first storage layer LAY1. The first storage layer LAY1 may function as, for example, registers and/or a cache memory. Referring to FIG. 1(a), the second storage layer LAY2, which is farther than the first storage layer LAY1 from the control layer LAY0 may include at least one array with a larger memory capacity than the first storage layer LAY1 and a longer access time than the first storage layer LAY1. The second storage layer LAY2 may function as a main memory.

Referring to FIG. 1(b), the third storage layer LAY3, which is farthest from the control layer LAY0, may include at least one array with a large memory capacity and a long access time. The second storage layer LAY2, which is farther than the first storage layer LAY1 from the control layer LAY0 and closer than the storage layer LAY3 to the control layer LAY0, may include at least one array with a memory capacity that is larger than the first storage layer LAY1 and smaller than the third storage layer LAY3, and an access time that is longer than the first storage layer LAY1 and shorter than the third storage layer LAY3. The second storage layer LAY2 may function as, for example, a cache memory. According to example embodiments, memory arrays in different layers of the semiconductor memory device 100 may have different capacities and access times.

FIG. 1 illustrates semiconductor memory devices including two storage layers and semiconductor memory devices including three storage layers. However, the number of storage layers is not limited thereto. The semiconductor memory device 100 according to example embodiments may include, for example, any number of storage layers. Hereinafter, for ease of description, a semiconductor memory device including three storage layers as illustrated in FIG. 1(b) may be described. Hereinafter, semiconductor memory devices including three storage layers with a structure that may be suitable in consideration of the characteristics of the storage layers described above according to various example embodiments may be described.

Figure 2:
Figure 2:
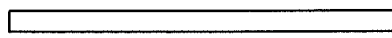
Figure 2:
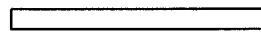
Figure 2:
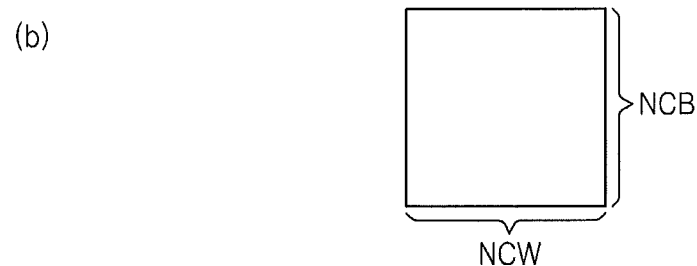

FIG. 2 includes block diagrams illustrating examples of storage layers of FIG. 1(b). Referring to FIG. 2(a), the first through third storage layers LAY1-LAY3 may include arrays ARR11, ARR21 and ARR31, respectively. One storage layer may include one array. The array ARR11 of the first storage layer LAY1, which is closest to the control layer LAY0, may be the smallest size array, and the array ARR31 of the third storage layer LAY3, which is farthest from the control layer LAY0, may be the largest size array. A larger array may be of greater capacity (memory capacity) than a smaller array. Referring to FIG. 2(b), in each of the arrays ARR11, ARR21 and ARR31 of the first through third storage layers LAY1-LAY3, a number of cells NCB that are connected to one bit line may be identical to the number of cells NCW that are connected to one word line.

Referring to FIG. 2(a), memory cells included in sub arrays of the same array may be homogenous. For example, regarding sub arrays of a same array, read latency, write latency and random read speed may be the same. An access time of the smallest array ARR11 of the first storage layer LAY1 may be reduced and an access time of the largest array ARR31 of the third storage layer LAY3 may be increased. By including the storage layers as illustrated FIG. 2(a), an access time of the first storage layer LAY1, which is closest to the control layer LAY0, may be set to be the shortest and an access time of the third storage layer LAY3, which is farthest from the control layer LAY0, may be set to be the longest. The semiconductor memory device 100 according to example embodiments may be optimized and/or configured to store a relatively small amount of data with a relatively high access frequency in the first storage layer LAY1, which is closest to the control layer LAY0, and a relatively large amount of data with a relatively low access frequency in the third storage layer LAY3, which is farthest from the control layer LAY0.

Figure 3A:
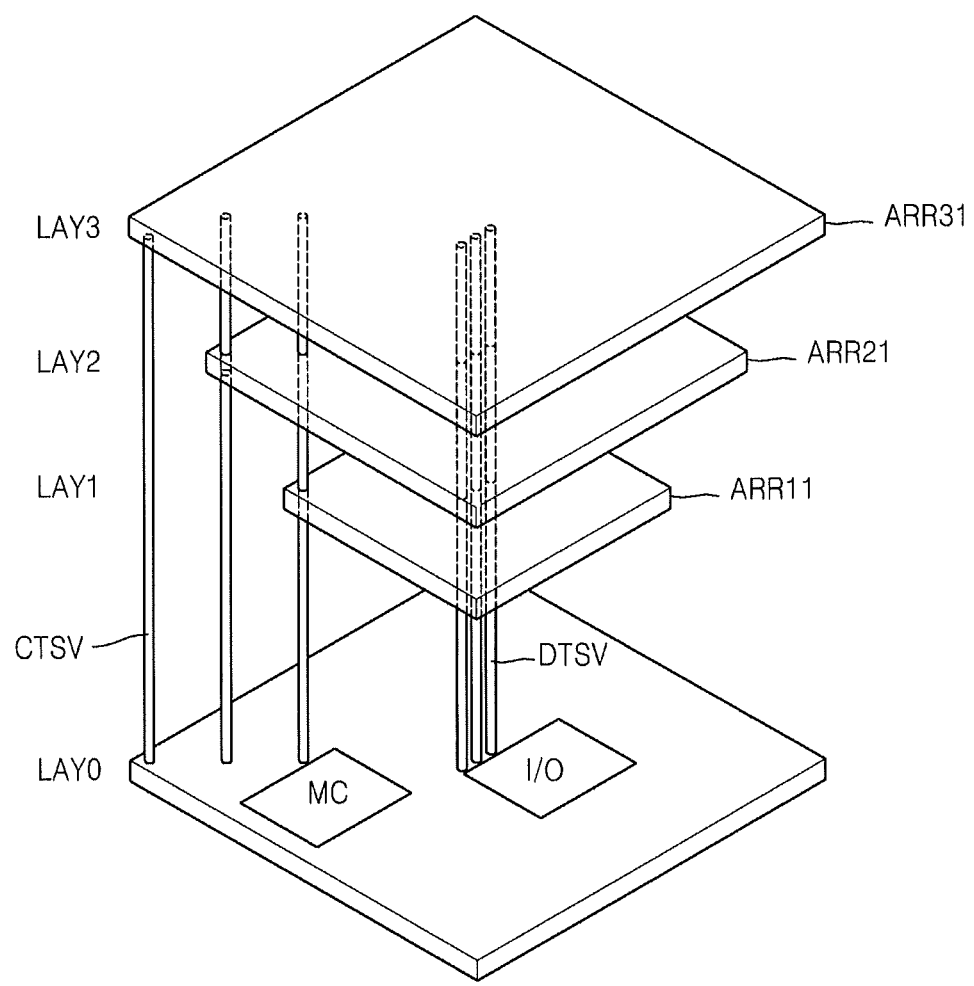
FIGS. 3A and 3B are perspective schematics illustrating semiconductor memory devices including the storage layers of FIG. 2A.
Figure 3B:
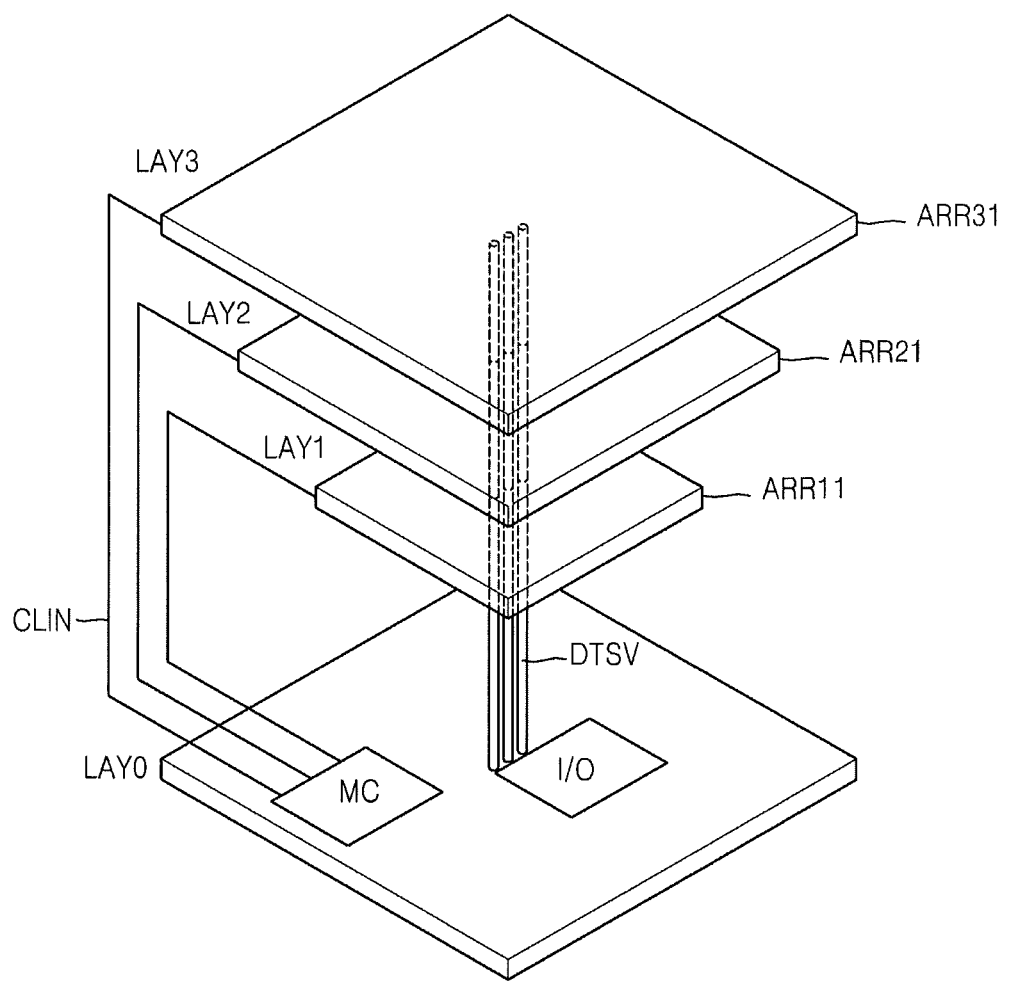

FIGS. 3A and 3B are perspective schematics illustrating semiconductor memory devices including the storage layers of FIG. 2(a). Referring to FIG. 3A, a control signal and data may be transmitted to the arrays ARR11-ARR31 through one or more control TSVs CTSV and one or more data TSVs DTSV. The control TSV CTSV and data TSV DTSV may pass through the control layer LAY0 and the arrays ARR11-ARR31 of the first through third storage layers LAY1-LAY3, in which sizes of the arrays ARR11-ARR31 are different from each other. The data TSVs DTSV may be located at centers of the arrays ARR11-ARR31 and the control TSVs CTSV may be located at corners of the arrays ARR11-ARR31. However, the locations of the data TSVs DTSV and the control TSVs CTSV may not be limited thereto. In a semiconductor memory device according to example embodiments of the inventive concept, the input and output of a control signal and/or data among the arrays ARR11-ARR31 of the first through third storage layers LAY1-LAY3 may also be performed through data lines and/or control lines which are connected to each other outside the arrays ARR11-ARR31. Referring to FIG. 3B, a control signal may be transferred through control lines CLIN connected outside the arrays ARR11-ARR31, instead of through a TSV. Hereinafter, for ease of description, example embodiments in which a control signal and data are transferred to the arrays ARR11-ARR31 through a TSV may be described although example embodiments are not so limited.

A semiconductor memory device according to example embodiments of the inventive concepts may include one storage layer with one array. Example embodiments of the inventive concepts are not limited thereto.

Figure 4:

FIG. 4 is a block diagram illustrating other examples of the first through third storage layers LAY1-LAY3 of FIG. 1B. Referring to FIG. 4, a second storage layer LAY2 may include larger arrays than the first storage layer LAY1 and the third storage layer LAY3 may include larger arrays than the second storage layer LAY2. A number of arrays may increase from the first storage layer LAY1 to the third storage layer LAY3. For example, the first storage layer LAY1 may include an array ARR11, the second storage layer LAY2 may include two arrays ARR21 and ARR22, and the third storage layer LAY3 may include three arrays ARR31, ARR32 and ARR33. Example embodiments of inventive concepts are not limited thereto. For example, the second storage layer LAY2 may include three or more arrays and the third storage layer LAY3 may include four or more arrays.

Figure 5:
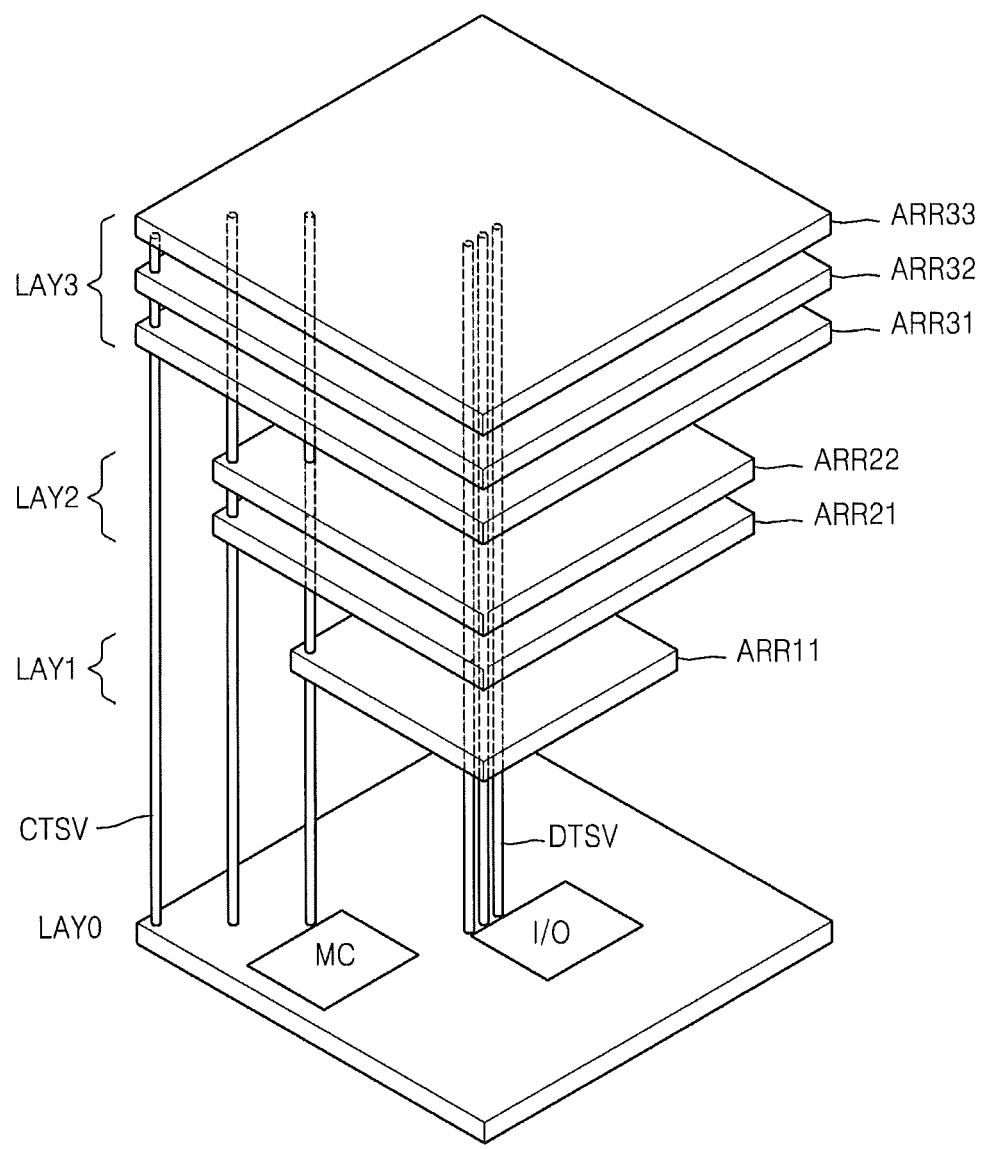

FIG. 5 is a perspective schematic illustrating semiconductor memory devices including first through third storage layers LAY1-LAY3 of FIG. 4. Referring to FIG. 5, a control signal and data may be transmitted to the arrays ARR11-ARR33 through one or more control TSVs CTSV and one or more data TSVs DTSV. The control TSV CTSV and the data TSV DTSV may pass through the control layer LAY0 and the arrays ARR11-ARR33 of the first through third storage layers LAY1-LAY3, in which the number of arrays may increase from the first storage layer LAY1 to the third storage layer LAY3. Storage layers may include different numbers of arrays. Example embodiments of the inventive concepts are not limited thereto. Each of storage layers may include, for example, the same number of arrays.

Figure 6:
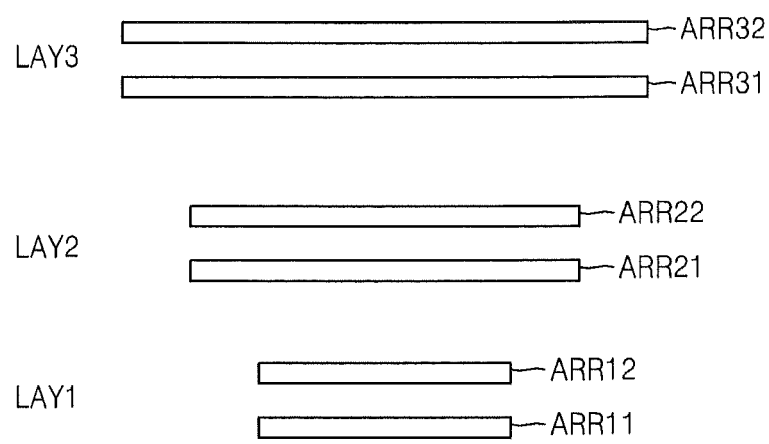

FIG. 6 is a block diagram illustrating still other examples of first through third storage layers LAY1-LAY3 of FIG. 1(b). Referring to FIG. 6, a second storage layer LAY2 may include larger arrays than the first storage layer LAY1 and the third storage layer LAY3 may include larger arrays than the second storage layer LAY2. Each of the first through third storage layers LAY1-LAY3 may include the same number of arrays. For example, the first storage layer LAY1 may include two arrays ARR11 and ARR12, the second storage layer LAY2 may include two arrays ARR21 and ARR22, and the third storage layer LAY3 may include two arrays ARR31 and ARR32. Example embodiments of the inventive concepts are not limited thereto. Each of the first through third storage layers LAY1-LAY3 may include, for example, the same number of three or more arrays.

Figure 7:
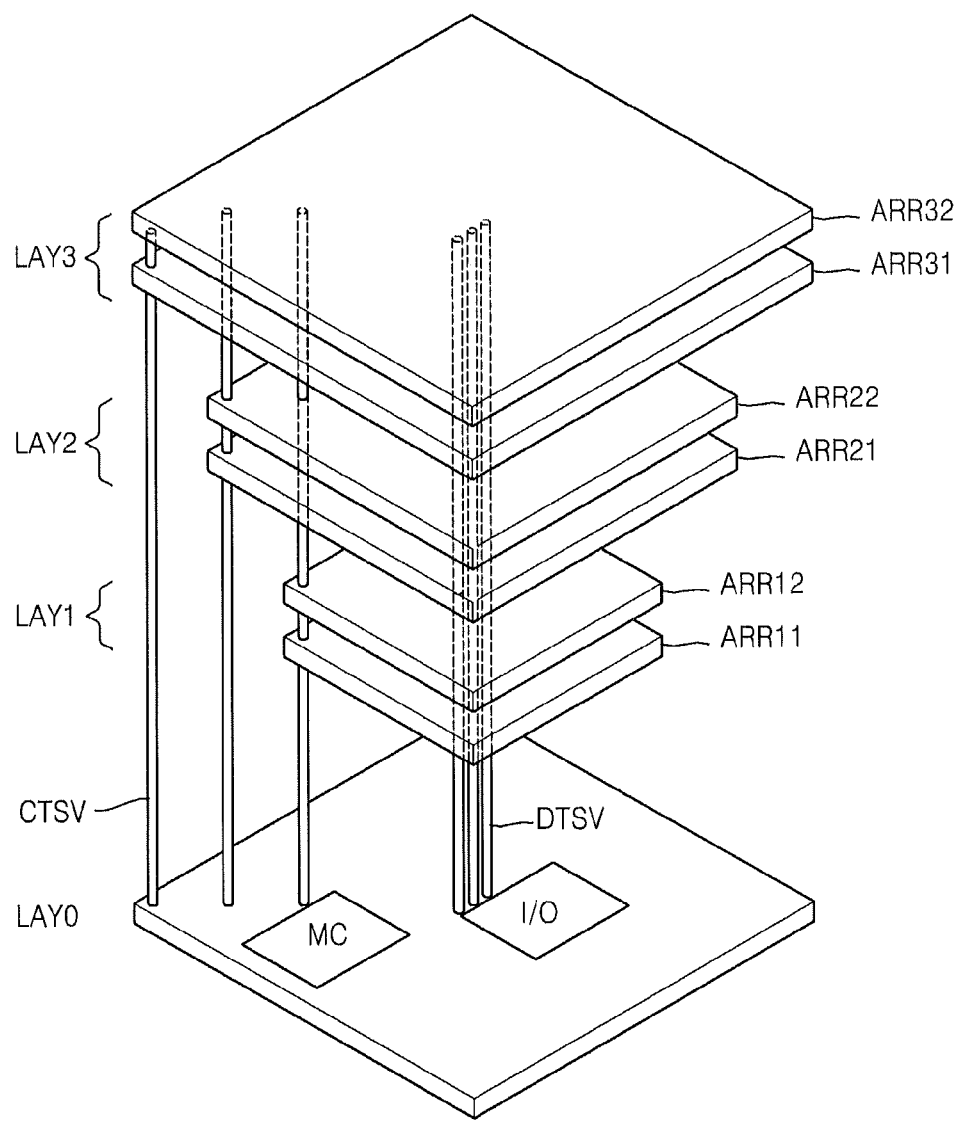

FIG. 7 is a perspective schematic illustrating semiconductor memory devices including first through third storage layers LAY1-LAY3 of FIG. 6. Referring to FIG. 7, a control signal and data may be transmitted to the arrays ARR11-ARR32 through one or more control TSVs CTSV and one or more data TSVs DTSV. The control TSV CTSV and the data TSVs DTSV may pass through the control layer LAY0 and the arrays ARR11-ARR32 of the first through third storage layers LAY1-LAY3. Each of the first through third storage layers LAY1-LAY3 may include the same number of arrays.

Figure 8:
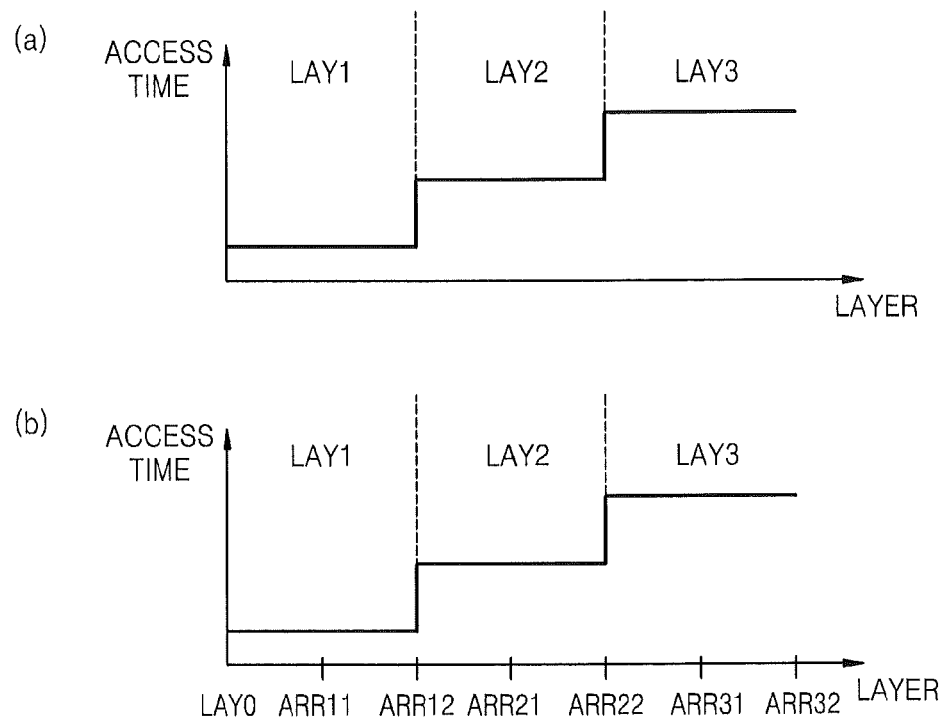

FIG. 8 includes graphs illustrating access times of storage layers illustrated in FIGS. 2-7. Referring to FIG. 8(a), as an array size increases from the first storage layer LAY1 to the third storage layer LAY3 in FIGS. 2-7, access time may increases in a tiered manner (e.g., stepwise). In the storage layers illustrated in FIGS. 4-7, arrays of the same storage layer may be homogeneous and have the same sizes. As illustrated in FIG. 8(b), a plurality of arrays of the same layer may have the same access time.

Figure 9:
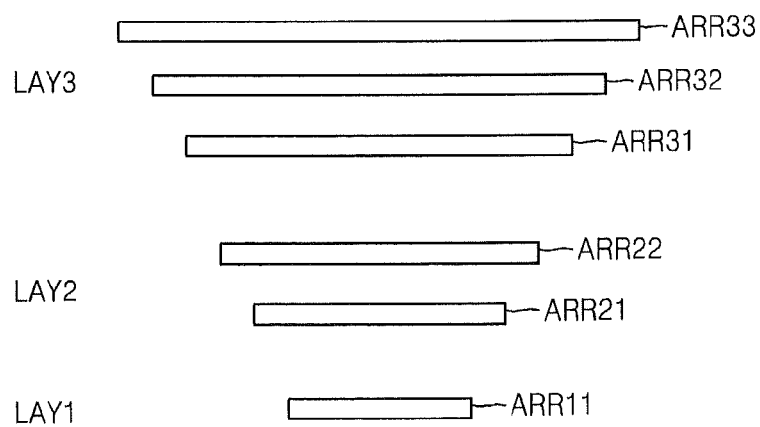

FIG. 9 is a block diagram illustrating yet other examples of first through third storage layers LAY1-LAY3 of FIG. 1(b). Referring to FIG. 9, the number of arrays of a same layer may increase from the first storage layer LAY1 to third storage layer LAY3. The first storage layer LAY1 may include an array ARR11, the second storage layer LAY2 may include two arrays ARR21 and ARR22, and the third storage layer LAY3 may include three arrays ARR31, ARR32 and ARR33. According to example embodiments, arrays of the same layer may be arranged such that the array size increases moving away from a control layer. For example, among the arrays ARR21 and ARR22 of the second storage layer LAY2, the array ARR22, which is farther than the array ARR21 from the control layer LAY0, may be larger than the array ARR21, which is closer than the array ARR22 to the control layer LAY0. Among the arrays ARR31, ARR32 and ARR33 of the third storage layer LAY3, the array ARR33, which is farther than the array ARR31 from the control layer LAY0, may be larger than the array ARR31, which is closer than the array ARR33 to the control layer LAY0.

Example embodiments of the inventive concepts are not limited to storage layers with a different number of arrays. For example, storage layers may include the same number of arrays as illustrated in FIG. 6. Sizes of arrays of the same storage layer may be set such that the longer a relative distance from the control layer, the larger the array.

Figure 10:
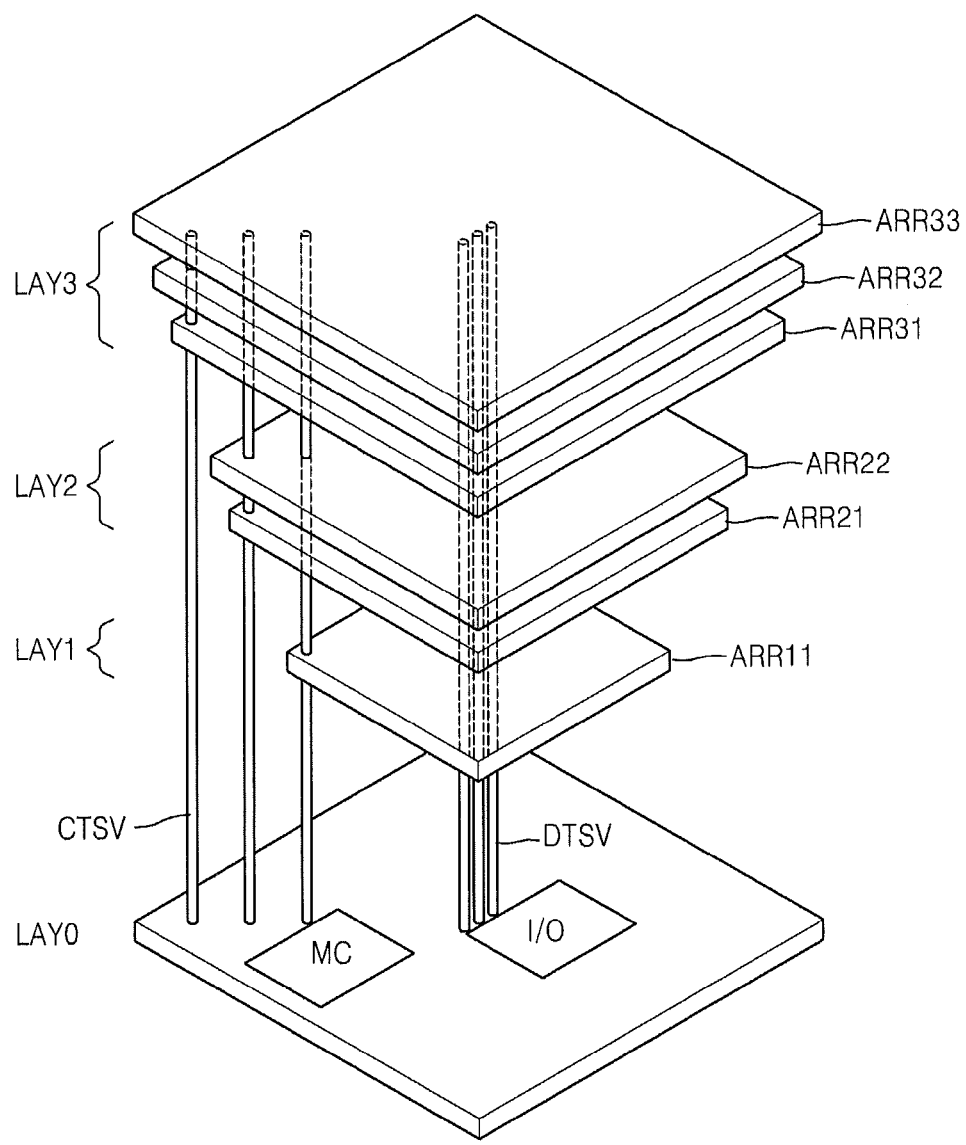
Figure 11:
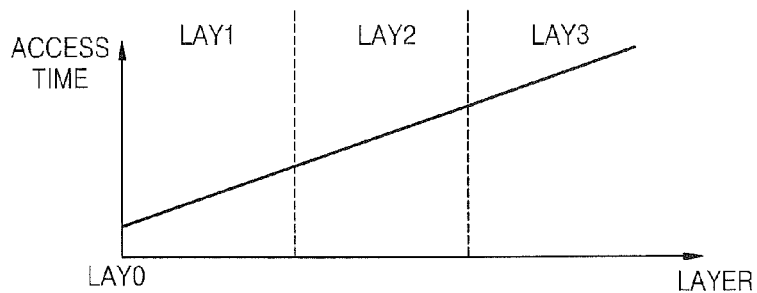

FIG. 10 is a perspective schematic illustrating semiconductor memory devices including first through third storage layers LAY1-LAY3 of FIG. 9. FIG. Referring to FIG. 10, a control signal and data may be transmitted to the arrays ARR11-ARR33 through one or more control TSVs CTSV and one or more data TSVs DTSV. The control TSV CTSV and the data TSV DTSV may pass through the control layer LAY0 and the arrays ARR11-ARR33 of the first through third storage layers LAY1-LAY3. Sizes of arrays of the first through third storage layers LAY1-LAY3 increase as a function of distance from the control layer LAY0. FIG. 11 is a graph illustrating access times of first through third storage layers LAY1-LAY3 of FIG. 9. Referring to FIG. 11, as sizes of arrays of the same storage layer increase as a distance between an array and a control layer increases, access time may monotonically increase according to a distance between the array and the control layer.

Figure 12:
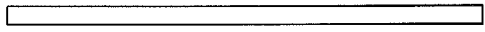
Figure 12:
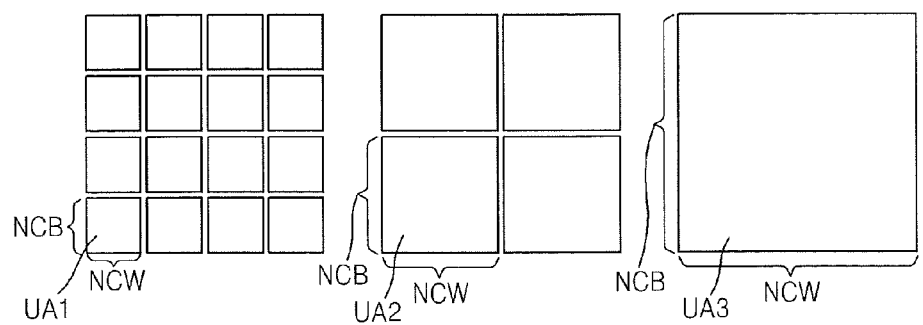

According to example embodiments, each storage layer may include arrays with the same kind of memory cells and access time of storage layers may be different according to sizes of arrays of the same storage layer. Example embodiments are not so limited. According to example embodiments, an array of each storage layer may be the same size and the arrays may be divided into different numbers of sub arrays and the access times of storage layers may be different FIG. 12 includes block diagrams illustrating further examples of first through third storage layers LAY1-LAY3 of FIG. 1(b). Referring to FIG. 12(a), first through third storage layers LAY1, LAY2 and LAY3 may include arrays ARR11, ARR21 and ARR31, respectively. The arrays ARR11, ARR21 and ARR31 may be the same size. The arrays ARR11, ARR21 and ARR31 may include different numbers of sub arrays (see UA1, UA2 and UA3 of FIG. 12(b)) therein. As the distance between an array and the control layer LAY0 increases, the number of sub arrays of the array may be reduced. As the distance between one array and the control layer LAY0 increases the size of sub arrays of the array may be increased. Referring to FIG. 12(b), the array ARR11 of the first storage layer LAY1, which is closest to the control layer LAY0, may be divided into 16 sub arrays. The array ARR21 of the second storage layer LAY2, which is father than the first storage layer LAY1 from the control layer LAY0 than the first storage layer LAY1, may be divided into 4 sub arrays. The array ARR31 of the third storage layer LAY3, which is farthest from the control layer LAY0, may not be divided.

If one array is divided into x number of sub arrays, the sub array UA1 of the first storage layer LAY1 may be the smallest size sub array and the sub array UA3 of the third storage layer LAY3 may be the largest size sub array. The number of cells NCB connected to one bit line and/or the number of cells NCW connected to one word line may differ according to the first through third storage layers LAY1-LAY3. The size of sub arrays of the same array may differ according to the first through third storage layers LAY1-LAY3. FIG. 12(b) may illustrate a case in which the number of cells NCB connected to one bit line and the number of cells NCW connected to one word line may differ according to the first through third storage layers LAY1-LAY3.

Referring to FIG. 12A, memory cells included in sub arrays of the same array may be homogeneous. With respect to sub arrays of the same array, read latency, write latency, random read speed and random write speed may be the same. An access time of the array ARR11 of the first storage layer LAY1 with the smallest sub arrays UA1 may be reduced, and an access time of the array ARR13 of the third storage layer LAY3 with the largest sub array UA3 may be increased. By including the storage layers as illustrated FIG. 12A, an access time of the first storage layer LAY1, which is closest to the control layer LAY0, may be set to be the shortest, and an access time of the third storage layer LAY3, which is farthest from the control layer LAY0, may be set to be the longest. According to example embodiments, a semiconductor memory device may be optimized and/or configured to store a relatively small amount of data with a relatively high access frequency in the first storage layer LAY1, which is closest to the control layer LAY0, and a relatively large amount of data with a low access frequency in the third storage layer LAY3, which is farthest from the control layer LAY0.

Figure 13:
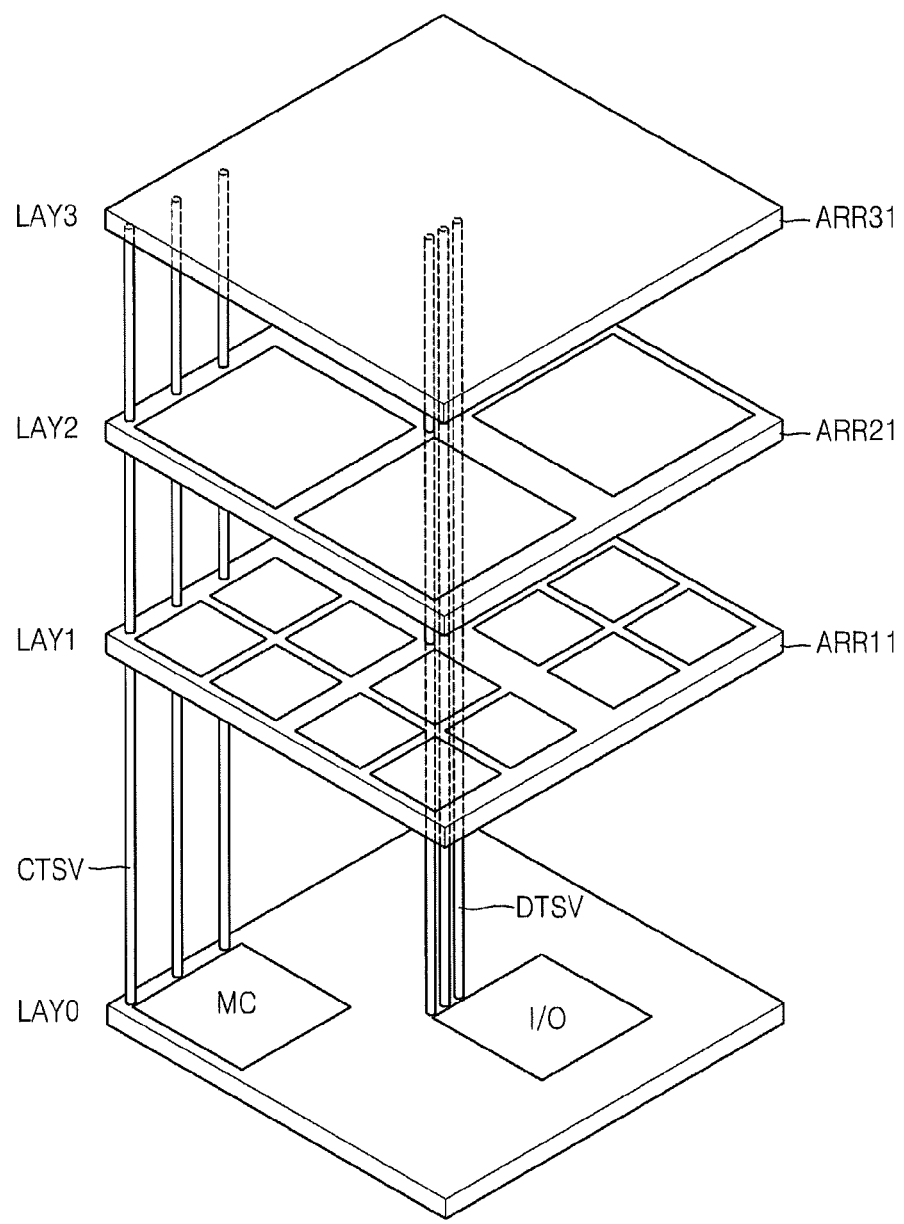

FIG. 13 is a perspective schematic illustrating semiconductor memory devices including first through third storage layers LAY1-LAY3 of FIG. 12. Referring to FIG. 13, a control signal and data may be transmitted to the arrays ARR11-ARR31 through one or more control TSVs CTSV and one or more data TSVs DTSV. The control TSV CTSV and the data TSV DTSV may pass through the control layer LAY0 and the arrays ARR11-ARR31 of the first through third storage layers LAY1-LAY3 including the sub array UA1, UA2 and UA3, in which the sizes of the sub arrays UA1-UA3 may be different from each other According to example embodiments one storage layer may include one array. Example embodiments of the inventive concepts are not limited thereto. For example, according to other example embodiments of the inventive concepts one storage layer may include a plurality of arrays.

Figure 14:
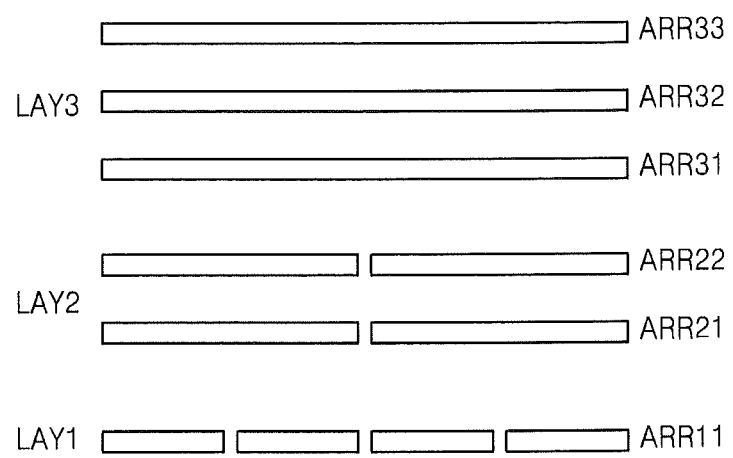

FIG. 14 is a block diagram illustrating still further examples of first through third storage layers LAY1-LAY3 of FIG. 1(b). Referring to FIG. 14, sizes of sub arrays of layers included in the first through third storage layers LAY1-LAY3 may increase from the first storage layer LAY1 to the third storage layer LAY3. According to example embodiments, the number of arrays of the storage layers may increase from the first storage layer LAY1 to the third storage layer LAY3. The first storage layer LAY1 may include an array ARR11 (e.g., with 16 sub arrays), the second storage layer LAY2 may include two arrays ARR21 and ARR22 (e.g., with 4 sub arrays), and the third storage layer LAY3 may include three arrays ARR31, ARR32 and ARR33 (e.g., with no sub arrays). Example embodiments of the inventive concepts are not limited thereto. For example, the second storage layer LAY2 may include three or more arrays, and the third storage layer LAY3 may include four or more arrays.

Figure 15:
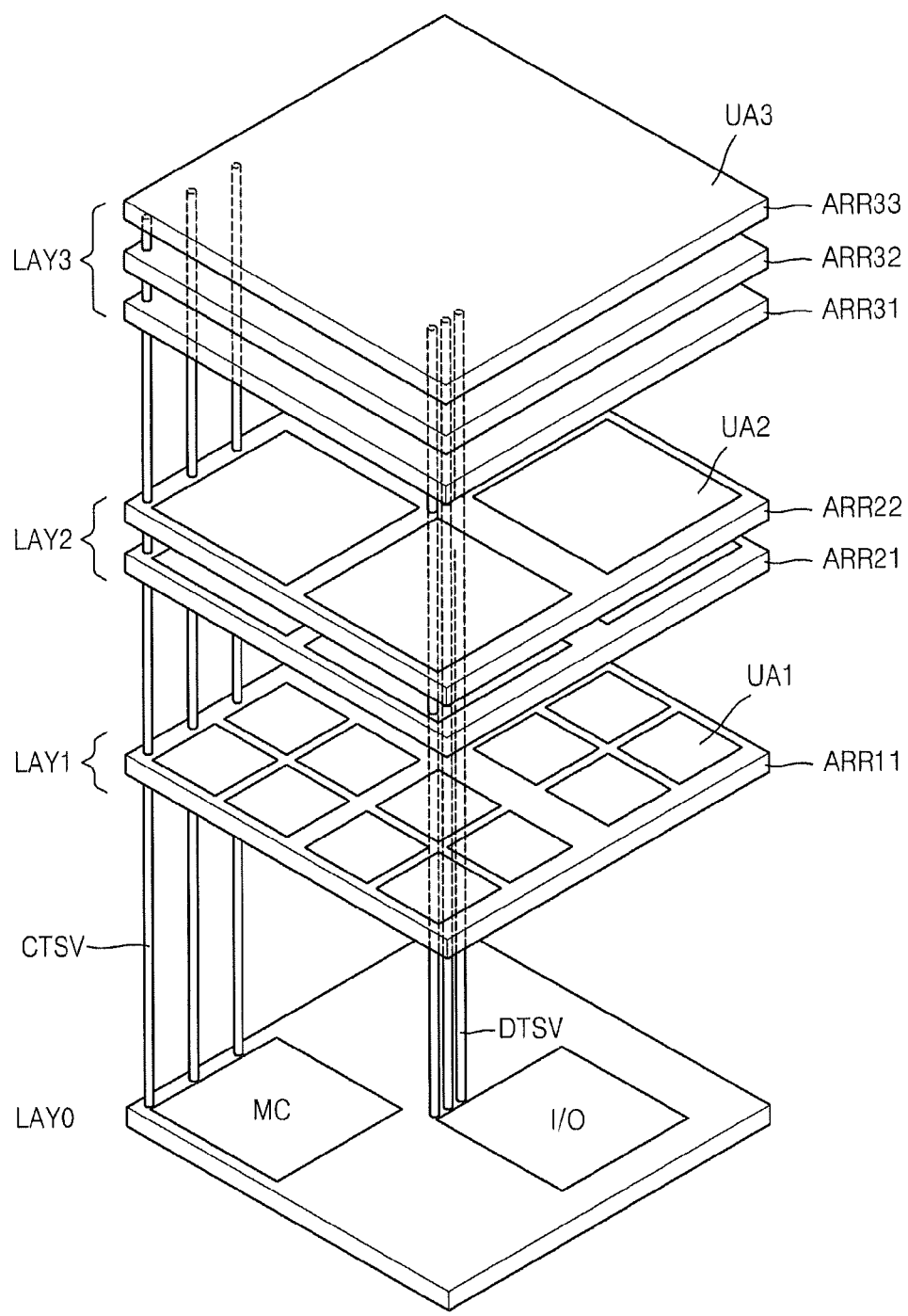

FIG. 15 is a perspective schematic illustrating semiconductor memory devices including first through third storage layers LAY1-LAY3 of FIG. 14. Referring to FIG. 15, a control signal and data may be transmitted to the arrays ARR11-ARR33 including the sub arrays UA1, UA2 and UA3 through one or more control TSVs CTSV and one or more data TSVs DTSV passing through the control layer LAY0 and the arrays ARR11-ARR33. The number of arrays may increase from the first storage layer LAY1 to the third storage layer LAY3, and sizes of the sub arrays UA1, UA2, and UA3 may be different from each other according to the first storage layer LAY1 through the third storage layer LAY3.

According to example embodiments, storage layers may include different numbers of arrays. Example embodiments of the inventive concepts are not limited thereto. For example, storage layers may each include the same number of arrays.

Figure 16:
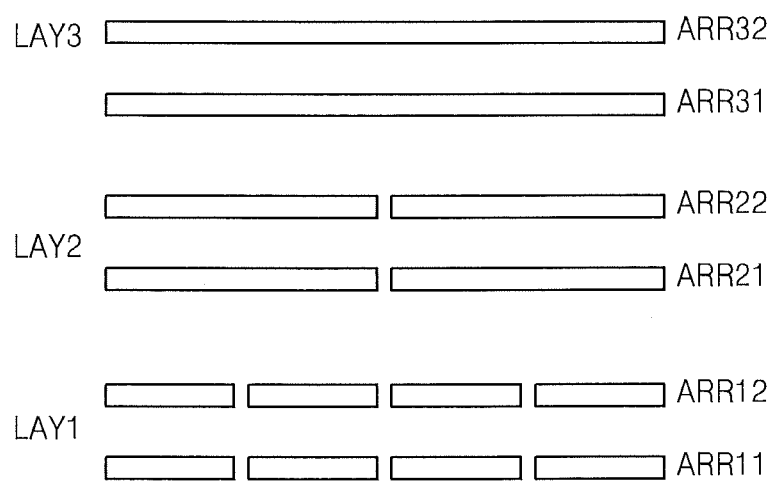

FIG. 16 is a block diagram illustrating yet further examples of first through third storage layers LAY1-LAY3 of FIG. 1(b). Referring to FIG. 16, sizes of sub arrays of layers included in the first through third storage layers LAY1-LAY3 may increase from the first storage layer LAY1 to the third storage layer LAY3. Storage layers may include the same number of arrays. The first storage layer LAY1 may include two arrays ARR11 and ARR12, the second storage layer LAY2 may include two arrays ARR21 and ARR22, and the third storage layer LAY3 may include two arrays ARR31 and ARR32. Example embodiments of the inventive concepts are not limited thereto. Each of the first through third storage layers LAY1-LAY3 may include, for example, three or more arrays.

Figure 17:
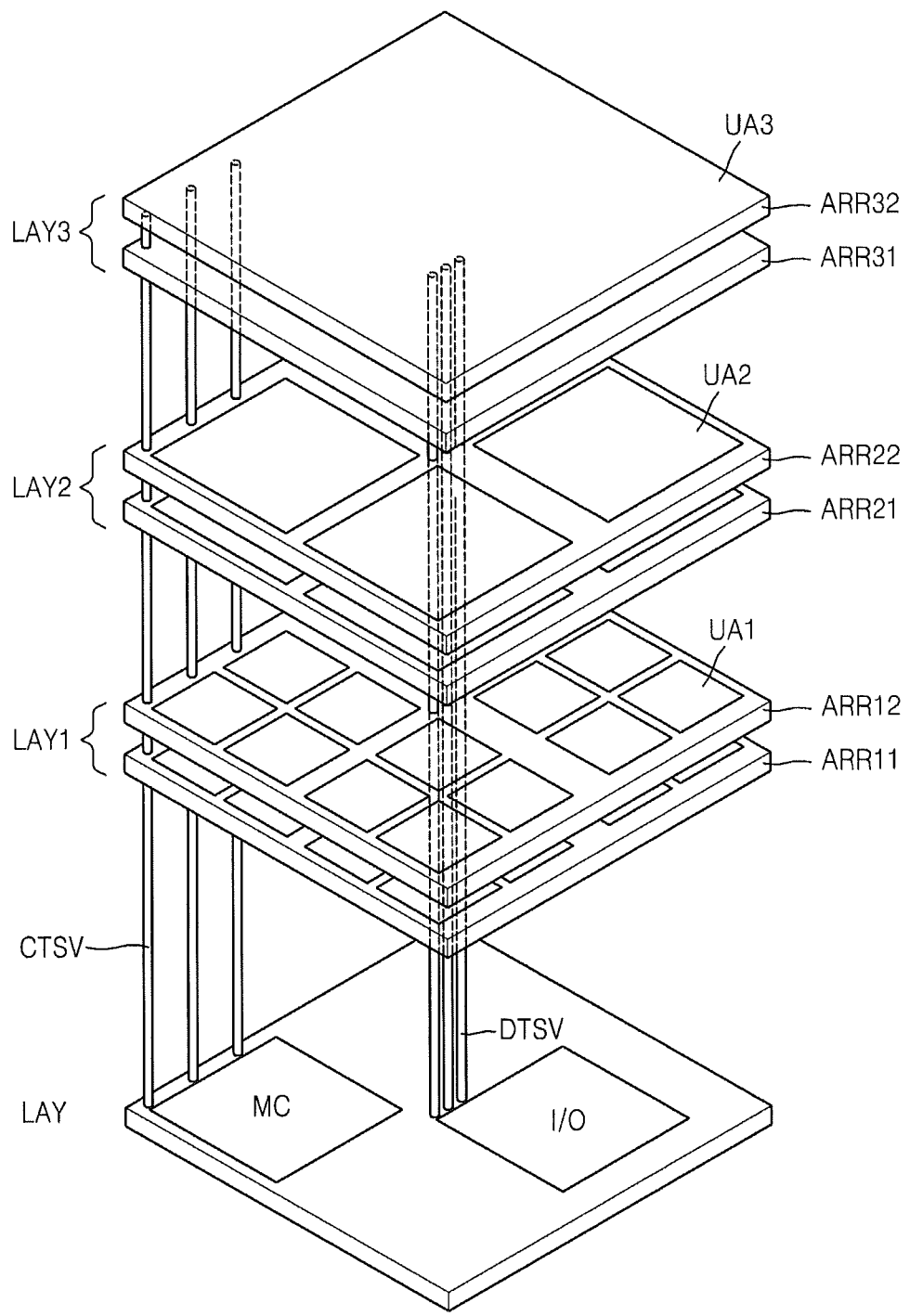

FIG. 17 is a perspective schematic illustrating semiconductor memory devices including first through third storage layers LAY1-LAY3 of FIG. 16. Referring to FIG. 17, a control signal and data may be transmitted to the arrays ARR11-ARR32 including the sub arrays UA1, UA2 and UA3 through one or more control TSVs CTSV and one or more data TSVs DTSV. The control TSV CTSV and the data TSV DTSV may pass through the control layer LAY0 and the arrays ARR11-ARR32. Each of the first storage layer LAY1 to the third storage layer LAY3 may include the same number of arrays, and sizes of the sub arrays UA1 UA2 and UA3 may be different from each other according to the first storage layer LAY1 through the third storage layer LAY3.

FIG. 8 may be a graph of access times of storage layers with structures as illustrated in FIGS. 12-17. As sizes of sub arrays of arrays increase from the first storage layer LAY1 to the third storage layer LAY3, the access times increase in a tiered manner (e.g., stepwise). When the same storage layer includes a plurality of arrays as illustrated in FIGS. 14-17, due to the same size of sub arrays of arrays of the same storage layer, arrays of the same storage layer may have the same access time as illustrated in FIG. 8(b).

According to example embodiments of the inventive concepts, the access time of the arrays of the same storage layer may be set to be different from each other according to a distance between the arrays and the control layer. If arrays of the same storage layer are divided into different numbers of sub arrays the access time of the arrays of the same storage layer may be set to be different from each other. For example, when, from among the arrays ARR31 and ARR32 of the third storage layer LAY3 of FIG. 16, the array ARR31, which is relatively closer to the control layer LAY0, is divided into sub arrays whose number is greater than that of the array ARR32, which is relatively farther than the array ARR31 from the control layer LAY0, the access time may be set to monolithically increase according to a distance between the control layer LAY0 and the arrays as illustrated in FIG. 11.

Figure 18:
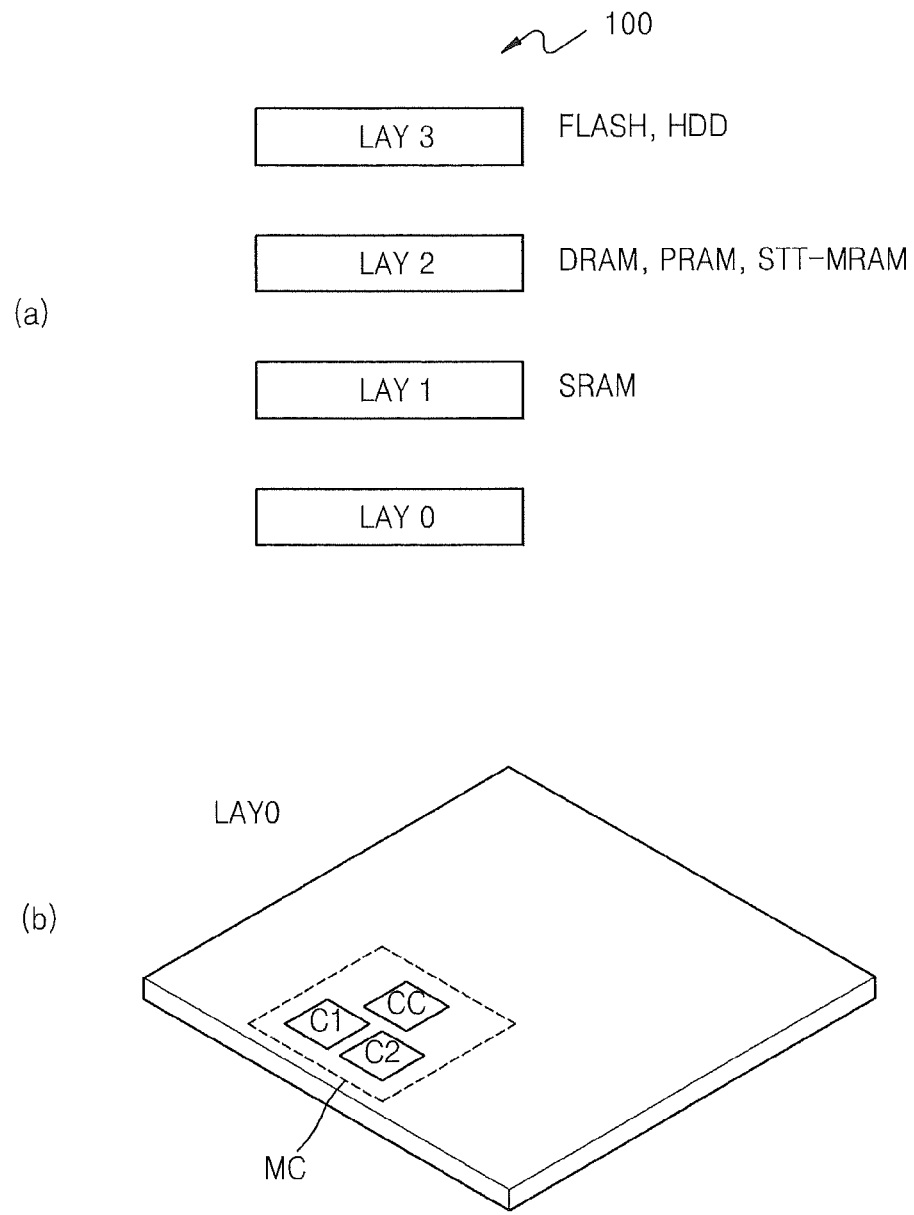

Storage layers according to example embodiments of the inventive concepts may include the same kind of arrays. For example, all the arrays of each storage layer may be DRAMs. The arrays of each storage layer may be flash memories. Example embodiments of the inventive concepts are not limited thereto. In a semiconductor memory device according to example embodiments of the inventive concepts, storage layers may include different types of memory according to characteristics of for example, the storage layers of FIG. 1. For example, as illustrated in FIG. 18(a), a first storage layer LAY1 storing small unit data that is accessed with high frequency may include SRAM. The third storage layer LAY3 storing large unit data that is accessed with low frequency may be a hard disc and/or a flash memory. Storage layers between the first storage layer LAY1 and the third storage layer LAY3, for example, the storage layer LAY2, may include DRAM, PRAM and/or STT-MRAM.

When storage layers include different kinds of memory, the memory controller MC of the control layer LAY0 may include, as illustrated in FIG. 18(b), control logic C1 and C2 for the different kinds of memory, and an integration control logic CC for controlling the control logic C1 and C2 for the different kinds of memory to transmit data between the different kinds of memory.

Figure 19:
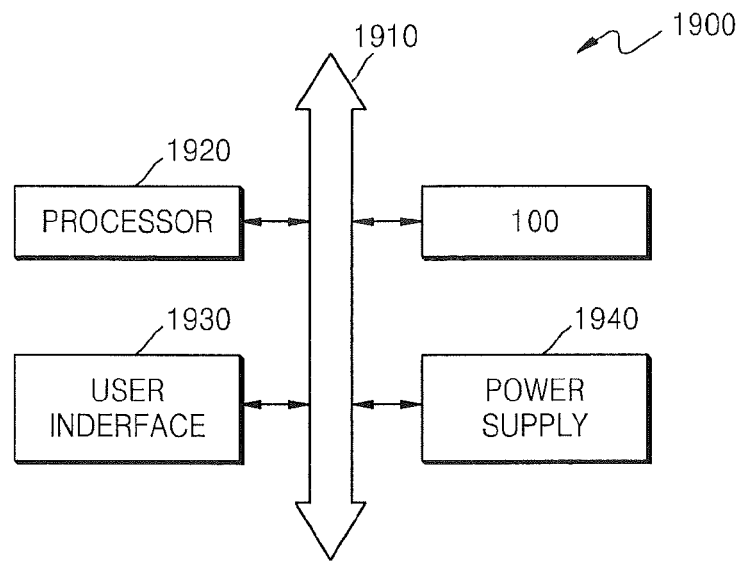

FIG. 19 is a block diagram illustrating a computing system apparatus 1900 including one or more semiconductor memory devices according to example embodiments of the inventive concepts. The computing system apparatus 1900 according to example embodiments may include a processor 1920, a user interface 1930 and a semiconductor memory device 100 which are electrically connected to a bus 1910. The semiconductor memory device 100 may be any one of the semiconductor memory devices described with respect to FIGS. 1-18. The semiconductor memory device 100 may store N-bit data that is treated or to be treated by the processor 1920, where N is an integer equal to or greater than 1. The computing system apparatus 1900 may further include a power supply device 1940.

Figure 20:
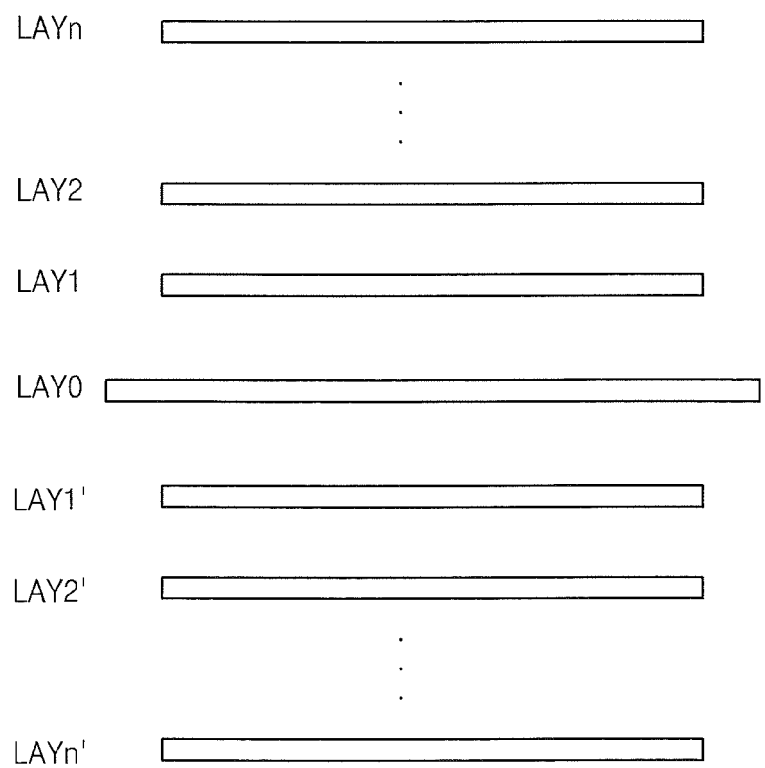

FIG. 20 is a block diagram of even further examples of storage layers of FIG. 1(b). According to example embodiments, optimal and/or improved semiconductor memory devices may be provided. The terms used herein are for illustrative purposes only and are not intended to limit the scope of example embodiments of the inventive concepts. For example, in FIG. 1, a control layer is a lowermost layer, but the present inventive concept is not limited thereto. Referring to FIG. 20, a control layer LAY0 may be between storage layers LAY1-LAYn and storage layers LAY1'-LAYn'. According to example embodiments, features of different example embodiments may be combined and such combinations are contemplated by example embodiments of the inventive concepts. For example, when a semiconductor memory device includes different kinds of memory, storage layers may have different sizes as illustrated in FIG. 2. As another example, example embodiments described with respect to FIG. 2 in which storage layers include different array sizes may be combined with example embodiments described with respect to FIG. 12 in which storage layers include different array division numbers. Example embodiments of the inventive concepts include storage layers with different array sizes and different array division numbers.

While example embodiments have been particularly shown and described, it will be understood by one of ordinary skill in the art that variations in form and detail may be made therein without departing from the spirit and scope of the claims.

What is claimed is:

1. A semiconductor memory device, comprising:
a first storage layer including at least one first array;
a second storage layer on the first storage layer,
the second storage layer including at least one second array,
an access time of the at least one first array being less than an access time of the at least one second array, and
a memory capacity of the first storage layer different than a memory capacity of the second storage layer; and
a control layer for controlling read/write access to the first storage layer and the second storage layer based on a control signal,
wherein the first storage layer is closer to the control layer than the second storage layer.

2. The semiconductor memory device of claim 1, wherein the memory capacity of the at least one first array is less than the memory capacity of the at least one second array.

3. The semiconductor memory device of claim 1, wherein the memory capacity of the first storage layer is less than the memory capacity of the second storage layer.

4. The semiconductor memory device of claim 1, wherein an array size of the at least one first array is less than an array size of the at least one second array.

5. The semiconductor memory device of claim 1, wherein the first storage layer includes fewer arrays than the second storage layer.

6. The semiconductor memory device of claim 1, wherein each of the first storage layer and the second storage layer include a same number of arrays.

7. The semiconductor memory device of claim 1, wherein the at least one first array is a first plurality of arrays of a same size, and
the at least one second array is a second plurality of arrays of a same size.

8. The semiconductor memory device of claim 1, wherein the at least one first array is a first plurality of arrays, the first plurality of arrays increasing in size as a function of distance from the control layer, and
the at least one second array is a second plurality of arrays, the second plurality of arrays increasing in size as a function of distance from the control layer.

9. The semiconductor memory device of claim 1, wherein the at least one first array includes at least one first sub array,
the at least one second array includes at least one second sub array, and
a size of the at least one second sub array is greater than a size of the at least one first sub array.

10. The semiconductor memory device of claim 9, wherein the at least one second array is a second plurality of arrays, and
a number of arrays of the at least one first array is less than a number of arrays of the second plurality of arrays.

11. The semiconductor memory device of claim 9, wherein the first storage layer and the second storage layer include a same number of arrays.

12. The semiconductor memory device of claim 9, wherein the at least one first array is a first plurality of arrays,
the at least one second array is a second plurality of arrays, each sub array included in the first storage layer is a same size, and each sub array included in the second storage layer is a same size.

13. The semiconductor memory device of claim 9, wherein the at least one first array is a first plurality of arrays, the at least one second array is a second plurality of arrays, the at least one first sub array is a first plurality of sub arrays, the first plurality of sub arrays increasing in size as a function of distance from the control layer, and the at least one second sub array is a second plurality of sub arrays, the second plurality of sub arrays increasing in size as a function of distance from the control layer.

14. The semiconductor memory device of claim 1, wherein each of the first storage layer and the second storage layer include a same kind of array.

15. The semiconductor memory device of claim 1, wherein the first storage layer and the second storage layer include different kinds of arrays, and the control layer includes
 a first control logic configured to control the first storage layer,
 a second control logic configured to control the second storage layer, and
 an integration control logic configured to control the first and second control logic and transmit a control signal and data between the different kinds of arrays.

16. The semiconductor memory device of claim 1, wherein the control signal and data are transmitted to the at least one first and second arrays of each of the first and second storage layers through a though silicon via (TSV).

17. A semiconductor memory device comprising:
 a control layer; and
 a plurality of storage layers each including at least one array, memory capacities of the arrays being relatively smaller the closer one of the plurality of storage layers is to the control layer,
 the plurality of storage layers including a first storage layer and a second storage layer,
 the first storage layer being closer to the control layer than the second storage layer,
 the at least one array of the first storage layer having an access time that is less than an access time of the at least one array of the second storage layer, and
 the control layer being configured to control read/write access to the arrays of the plurality of storage layers based on a control signal.

18. The semiconductor memory device of claim 17, wherein the control layer is adjacent to one of the plurality of storage layers.

19. The semiconductor memory device of claim 17, wherein the control layer is adjacent to two of the plurality of storage layers.

20. A semiconductor device, comprising:
 a memory controller;
 a first memory array; and
 a second memory array a greater distance from the memory controller than the first memory array, a first word line of the first memory array connected to fewer memory cells than a second word line of the second memory array.

21. The device of claim 20, wherein a first bit line of the first memory array is connected to fewer memory cells than a second bit line of the second memory array.

22. The device of claim 21, wherein the first memory array includes a plurality of sub arrays, and
 the first memory array includes a greater number of word line drivers than the second memory array.

* * * * *